United States Patent [19]
LeCornu et al.

[11] Patent Number: 6,134,112
[45] Date of Patent: Oct. 17, 2000

[54] HEAT SINK ATTACHMENT

[75] Inventors: Herbert E. LeCornu, Newark; Ronald Barnes, Livermore; Nagaraj P. Mitty, San Jose, all of Calif.

[73] Assignee: Sun Microsystems, Inc., Palo Alto, Calif.

[21] Appl. No.: 08/883,849

[22] Filed: Jun. 27, 1997

[51] Int. Cl.[7] ........................................... H05K 7/20
[52] U.S. Cl. .................... 361/720; 361/704; 361/719; 361/760; 257/718; 257/719; 174/16.3
[58] Field of Search .................... 361/719, 720, 361/704; 257/718, 719; 165/80.2, 80.3; 248/510, 505, 507, 316.7; 267/150, 158, 160; 711/352; 24/457, 458, 499, 564

[56] References Cited

U.S. PATENT DOCUMENTS

| | | | |
|---|---|---|---|
| 4,351,580 | 9/1982 | Kirkman et al. | 439/71 |
| 5,241,453 | 8/1993 | Bright et al. | 361/704 |
| 5,307,236 | 4/1994 | Rio et al. | 361/720 |
| 5,331,507 | 7/1994 | Kyung et al. | 361/720 |
| 5,381,305 | 1/1995 | Harmon et al. | 361/704 |

FOREIGN PATENT DOCUMENTS

| | | |
|---|---|---|
| 195 15 073 | 10/1996 | Germany . |
| 05198714 | 8/1993 | Japan . |
| WO 96 29850 | 9/1996 | WIPO . |

*Primary Examiner*—Leo P. Picard
*Assistant Examiner*—Boris L. Chervinsky
*Attorney, Agent, or Firm*—Conley, Rose & Tayon, PC; B. Noel Kivlin

[57] ABSTRACT

To restrain detachment of heat sinks from printed circuit boards (PCBs) or the components mounted on such boards, a body is attached to the board and extends above the tops of the heat sinks. Above each heat sink, three sides of a rectangle are cut from the body, leaving one side uncut. The tongue thus formed is curved downwards to form a spring which bears against the top of the heat sink to protect the heat sink from disengagement. The body is formed with vertical ends or legs having outward bent feet which are secured to the PCB by screws or other fasteners or are fit through slots in the PCB. A slanted tongue may also be cut from the body to engage an upper corner of a heat sink to restrain the heat sink from lateral movement relative to the PCB.

7 Claims, 3 Drawing Sheets

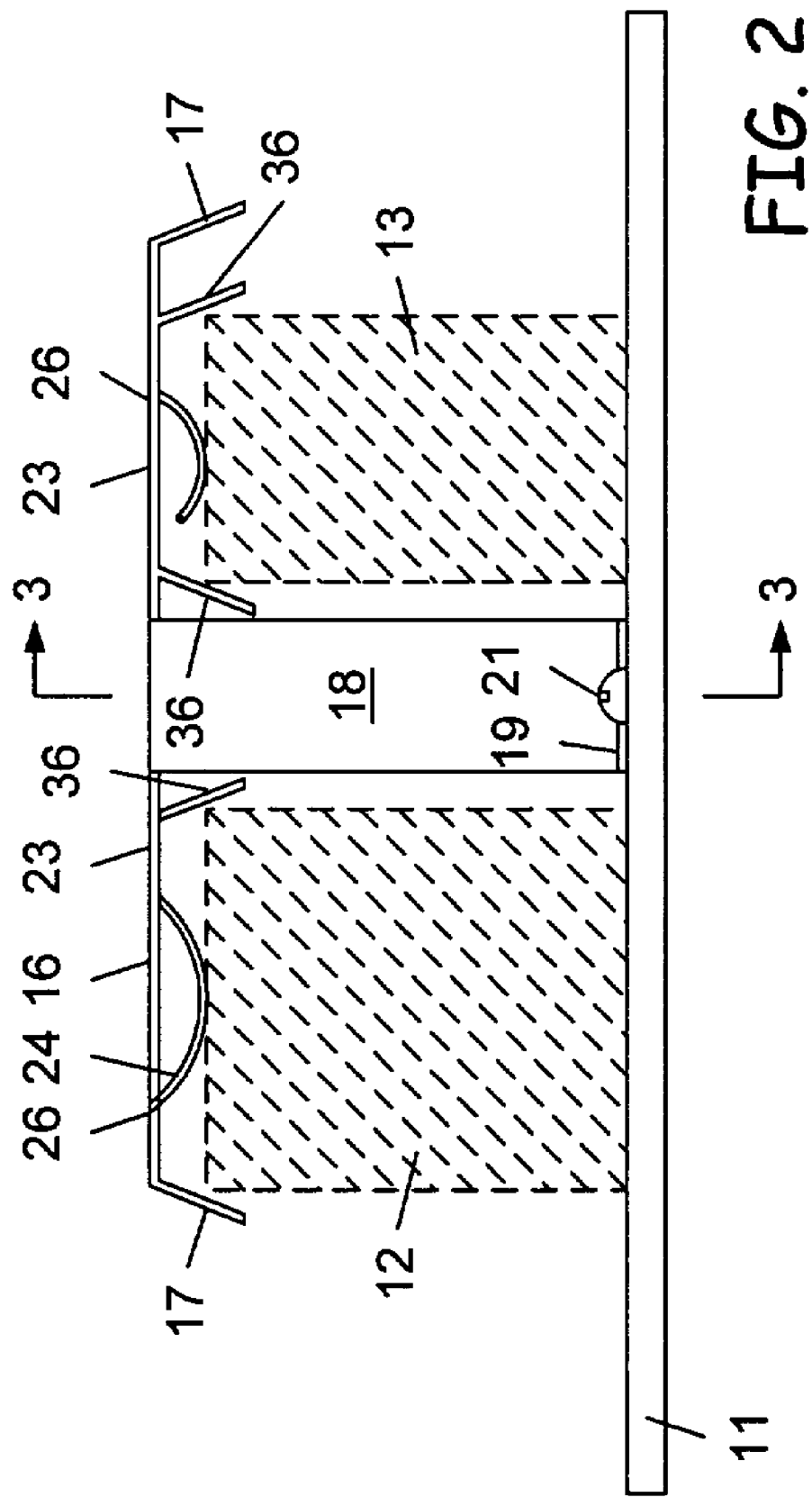

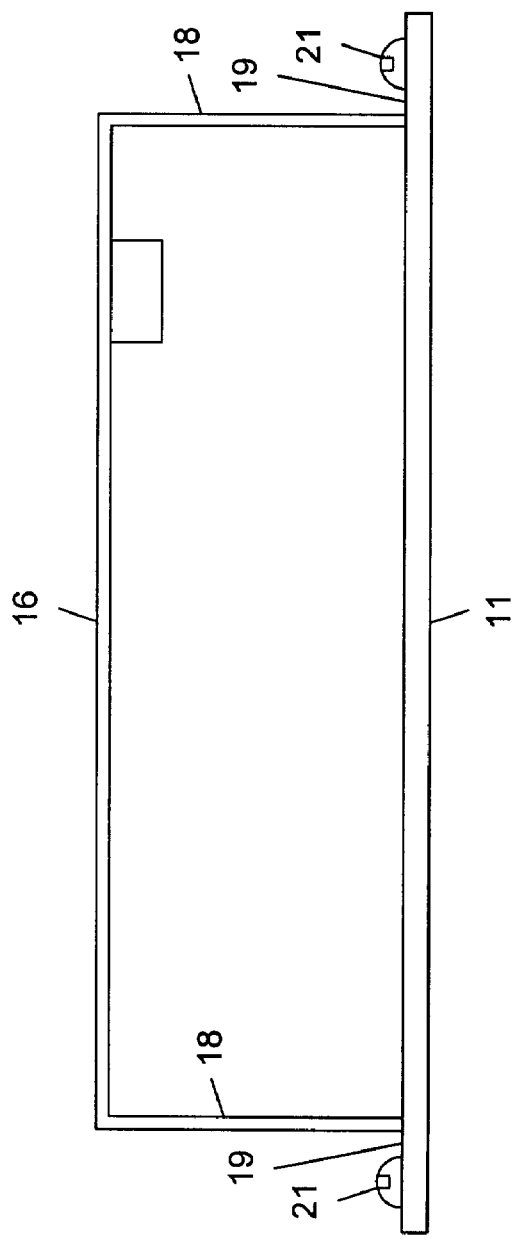
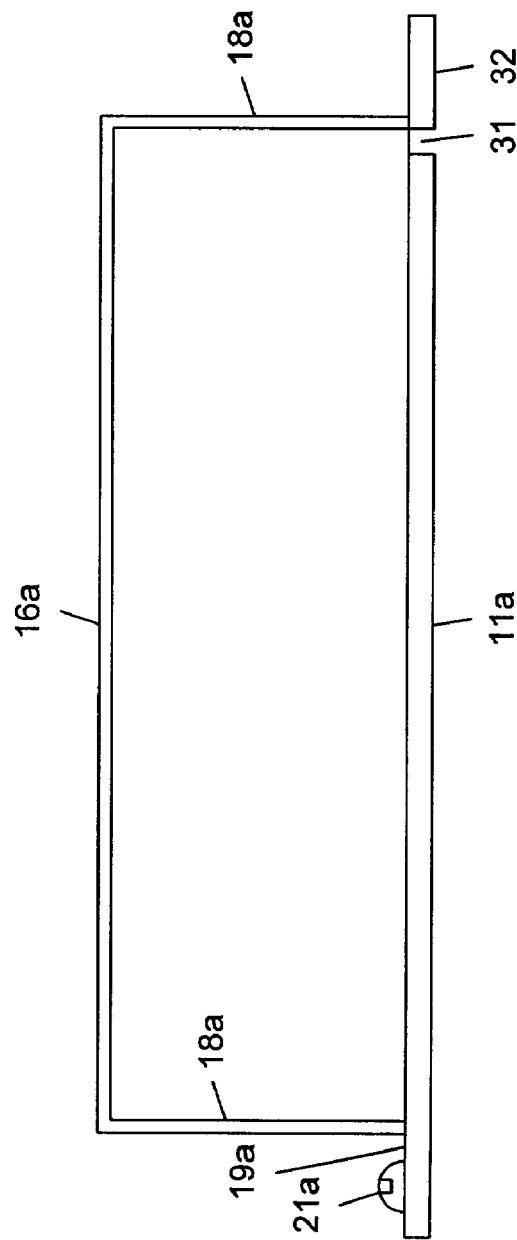

HEAT SINK ATTACHMENT

BACKGROUND OF THE INVENTION

1. Field of the Invention

This invention relates to a new and improved heat sink attachment to prevent heat sinks from being detached from PCBs or components mounted on PCBs when subjected to vibration or shock.

2. Description of Related Art

Heat sinks applied to heat generating components mounted on printed circuit boards and the like are well known in the electronics industry. When subjected to shock or vibration, the heat sinks are sometimes dislodged or thermal contact is diminished. The present invention provides an attachment which spring biases the components into firm contact with the underlying components or PCBs.

SUMMARY OF THE INVENTION

It is desirable to secure ASIC (application specific integrated circuit) heat sinks on a PCB from a thermal and mechanical rigidity standpoint. During transportation and handling, shock, and vibration may dislodge such heat sinks. The present invention provides an inexpensive means to spring bias multiple heat sinks to hold them in place.

A body, preferably of metal, is supported by legs attached to the PCB board so that it extends above the tops of multiple heat sinks attached to the board. In a location above each heat sink, three sides of a rectangle are cut into the body, leaving one side uncut so that a tongue extends outward from the uncut side. The tongue is curved downwardly so that it acts as a spring. When the body is mounted on the board, springs bear against the tops of each heat sink, thereby protecting the heat sinks from disengagement from the board or from the components which underlie the heat sinks. To suspend the body in position, vertical legs are formed at opposed ends and each leg terminates in an outward bent foot which is secured to the PCB by screws or other fasteners or fit through slots in the PCB.

In some instances the PCB may be installed so that it is vertical or some other steep angle to the horizontal. In such cases slanted tongues are struck from the body to engage a corner of the heat sink to restrain it from moving relative to the board.

BRIEF DESCRIPTION OF THE DRAWINGS

The accompanying drawings, which are incorporated in and form a part of this specification, illustrate embodiments of the invention and, together with the description serve to explain the principles of the invention.

FIG. 2 is an end elevational view as viewed from the bottom of FIG. 1.

FIG. 3 is a vertical sectional view taken substantially along the line 3—3 of FIG. 2.

FIG. 3A is a view similar to FIG. 3 of a modification.

DESCRIPTION OF THE PREFERRED EMBODIMENTS

Figure 1:
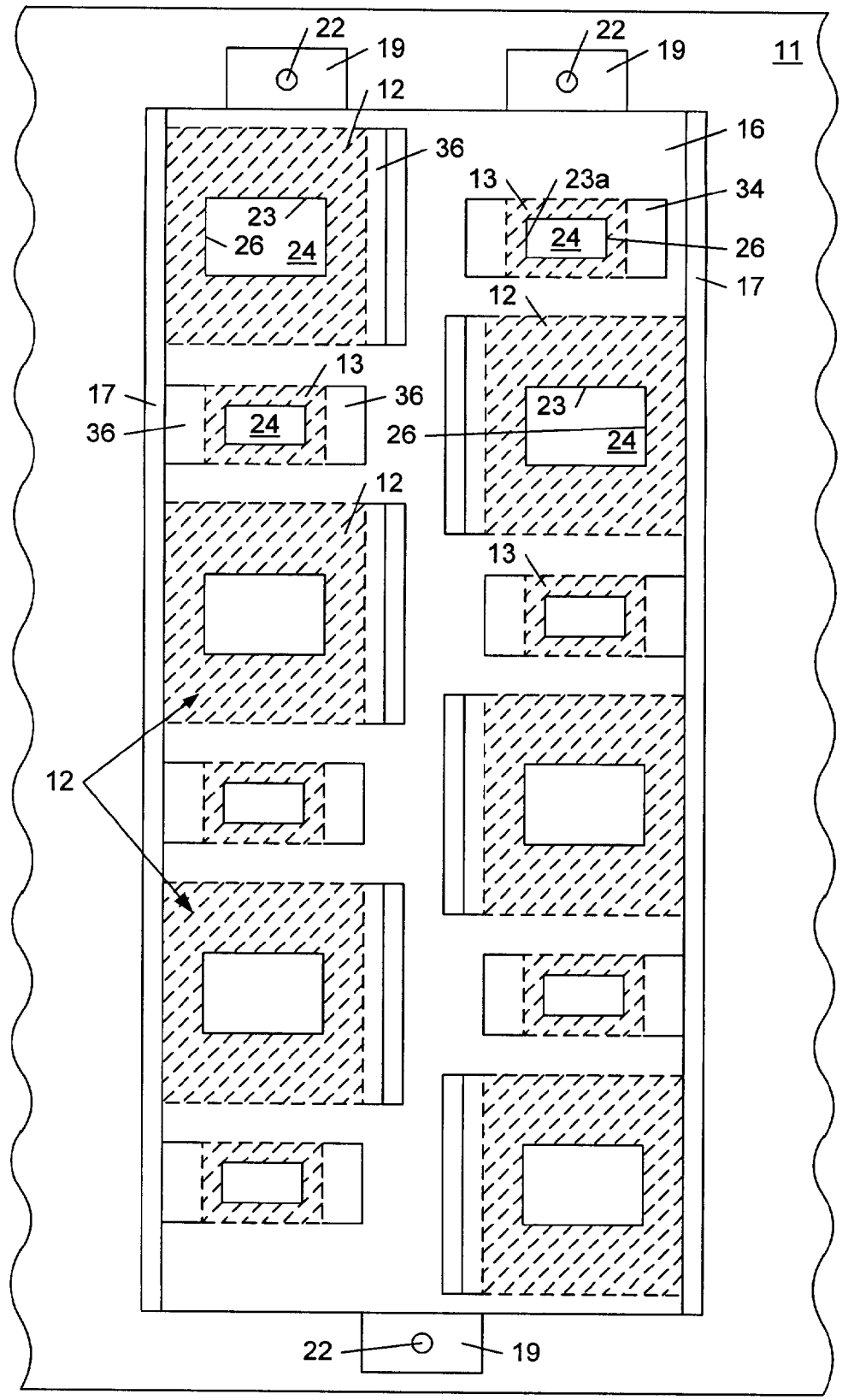
FIG. 1 is a schematic top plan view of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Printed circuit board (PCB) 11 is shown partially in FIG. 1. Heat generating electronic components (not shown) are mounted on board 11 at various locations. Typical heat sinks 12 and 13 are placed in intimate thermal contact with the components and dissipate the heat generated thereby to the surrounding atmosphere. Shock and/or vibration during transportation and handling may cause the heat sinks 12 or 13 to become dislodged or the heat transfer capabilities thereof to be reduced by reason of the fact that the heat sinks are not firmly attached to the components. The number, size and location of such heat sinks is subject to wide variation. As shown in FIGS. 1 and 2, two different sizes of heat sinks, respectively 12 and 13, are disclosed and these are positioned in various patterns. It will be understood that the number, relative size and positioning of such heat sinks 12 and 13 is subject to wide variation.

The attachment which is the subject of the present application comprises a body 16 preferably formed of a metal which is quite springy. Side edges 17 are preferably sloped downwardly-outwardly. At either end of body 16 are downwardly extending legs 19 and the outer ends of the legs are bent outwardly in feet 21. As shown in FIG. 1 there are two feet 19 at the top and one foot 19 at the bottom but it will be understood that this arrangement is subject to modification. Feet 19 are apertured in screw holes 22. Screws 21 or other fasteners may be used to hold down one or more of the feet 19 by attachment of the screws to the PCB 11 or other means.

Above each heat sink 12 or 13 a three-sided cut 23 is stamped or otherwise formed in body 16 leaving the fourth side 26 uncut so that a tongue 24 extends outwardly from side 26 as defined by the three-sided cut 23. The tongue 24 is formed curved downwardly as a spring which bears against the top of each heat sink 12 or 13 and thus prevents it from being dislodged.

Where the PCB is to be installed vertically or at a steep angle to the horizontal, tongues 36 may be formed in body 16 by forming three-sided cuts in the body and bending the material between the cuts downward at an angle. Tongues 36 are positioned to engage the upper corners of the heat sinks 12 or 13 to restrain sliding movement of the heat sinks relative to PCB 11.

In the modification of FIGS. 1–3, the fasterners 21 are applied, two at one end and one at the other. A modification is shown in FIG. 3A wherein a slot is formed in the PCB 11a. Foot 32 attached to the bottom of leg 18a is inserted through the slot 31 and screw 21a is used to fasten the foot 19a at the opposite end of the body 16a to the PCB 11a. In other respects the modification of FIG. 3A resembles that of the preceding modification in the same reference numerals followed by the subscript a are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An attachment fitting over a heat sink mounted over a component mounted on a PCB to secure the heat sink against disengagement in the event of shock or vibration comprising, a body located above a heat sink, a spring-like first tongue struck from said body and comprising a downwardly curved spring located to bear against the top of the heat sink, and a plurality of legs depending from said body to secure said body to the PCB a fixed distance from the PCB, said first tongue being formed by a three-sided rectangular cut, comprising a longitudinal first side and second and third side perpendicular to ends of said first side, said first tongue extending from an edge perpendicular to and joining ends of said second and third sides opposite said first side, and a slanted second tongue struck from said body positioned to be against an upper corner of the heat sink to restrain lateral movement of the heat sink, said legs being discrete from said first and second tongues.

2. An attachment according to claim 1 in which there is a plurality of heat sinks mounted on the PCB and said body is formed with a plurality of first tongues curved to form a plurality of springs, each said first tongues being positioned to bear against the top of a heat sink.

3. An attachment according to claim 1 in which said body is of spring metal.

4. An attachment according to claim 1 in which each said leg extends vertically down from said body and terminates in a foot.

5. An attachment according to claim 4 in which said foot is apertured and which further comprises a fastener through the aperture engaging the PCB slot.

6. An attachment according to claim 4 in which the PCB is formed with a slot aperture and in which at least one said foot extends through said slot.

7. In combination, a PCB, a plurality of heat sinks mounted on said PCB, a body extending substantially horizontally above said PCB and said heat sink, legs depending from said body engaging said PCB to support said body, a spring-like first tongue struck from said body and comprising a downwardly curved spring located to bear against the top of the heat sink, said first tongue being formed by a three-sided rectangular cut, comprising a longitudinal first side and second and third side perpendicular to ends of said first side, said first tongue extending from an edge perpendicular to and joining ends of said second and third sides opposite said first side, said body being formed with slanted, resilient second tongues engaging upper corners of a plurality of said heat sinks to restrain lateral movement of said heat sinks relative to said PCB, each said second tongue being cut from said body by a three-sided cut comprising a longitudinal first side and second and third sides perpendicular to ends of said first side, said second tongue extending from an edge perpendicular to and joining ends of said second and third sides opposite said first side, said legs being discrete from said first and second tongues.

* * * * *

UNITED STATES PATENT AND TRADEMARK OFFICE

CERTIFICATE OF CORRECTION

PATENT NO. : 6,134,112

DATED : October 17, 2000

INVENTOR(S) : Herbert E. LeCornu, Ronald Barnes and Nagaraj P. Mitty

It is certified that error appears in the above-identified patent and that said Letters Patent is hereby corrected as shown below:

Claim 1, col. 3, line 21, please change "be" to "bear".

Claim 5, col. 4, line 3, please delete "slot".

Signed and Sealed this

Twenty-second Day of May, 2001

Attest:

NICHOLAS P. GODICI

Attesting Officer

Acting Director of the United States Patent and Trademark Office